United States Patent [19]

Brennan

[11] Patent Number: 5,262,983

[45] Date of Patent: Nov. 16, 1993

[54] FERROELECTRIC SPACE CHARGE CAPACITOR ANALOG MEMORY

[75] Inventor: Ciaran J. Brennan, Bedford, Mass.

[73] Assignee: The Charles Stark Draper Laboratories, Cambridge, Mass.

[21] Appl. No.: 792,945

[22] Filed: Nov. 15, 1991

Related U.S. Application Data

[63] Continuation-in-part of Ser. No. 630,027, Dec. 19, 1990, Pat. No. 5,151,877, and a continuation-in-part of Ser. No. 630,038, Dec. 19, 1990, Pat. No. 5,140,548.

[51] Int. Cl.$^5$ .................. G11C 11/22; G11C 11/24; G11C 27/00

[52] U.S. Cl. .................. 365/145; 365/149; 365/45

[58] Field of Search .................. 365/117, 145, 149, 45, 365/190

[56] References Cited

U.S. PATENT DOCUMENTS

| | | | |
|---|---|---|---|
| 3,701,979 | 10/1972 | Smith et al. | 365/147 |
| 3,990,057 | 11/1976 | Kumada | 365/45 |
| 4,360,896 | 11/1982 | Brody | 365/145 |
| 4,873,664 | 10/1989 | Eaton, Jr. | 365/145 |
| 4,888,630 | 12/1989 | Paterson | 365/145 |
| 4,893,272 | 1/1990 | Eaton, Jr. et al. | 365/145 |
| 5,119,329 | 6/1992 | Evans, Jr. et al. | 365/145 |

FOREIGN PATENT DOCUMENTS 9106121  5/1991  Int'l Pat. Institute .

*Primary Examiner*—Eugene R. LaRoche
*Assistant Examiner*—Michael C. Kessell
*Attorney, Agent, or Firm*—Iandiorio & Dingman

[57] ABSTRACT

A ferroelectric space charge capacitor analog memory device includes a pair of spaced first and second electrodes; a ferroelectric dielectric disposed between the electrodes; and a signal source for applying to the dielectric a write signal equal to or greater than the coercive voltage to write the dielectric into a predetermined polarization state in the range from zero to maximum coerced polarization and to establish, proximate the interface between the dielectric and each electrode, a space charge region having a charge opposite to that applied to the electrode, with a neutral region between the space charge regions, the relative sizes of the neutral and space charge regions defining the capacitance of the dielectric, the neutral region having an internal polarization field opposite to that represented by the space charge regions; a bias source for applying to the dielectric a bias voltage less than the coercive voltage at a rate slower than the rate of space charge formation to define the capacitance level representative of the predetermined polarization state; the signal source for introducing to the dielectric a read signal at a rate faster than the rate of space charge formation which together with the bias voltage is less than the coercive voltage; and a current detector responsive to the introduction of the read signal to the dielectric for determining the capacitance level representative of the predetermined polarization state.

12 Claims, 3 Drawing Sheets

FERROELECTRIC SPACE CHARGE CAPACITOR ANALOG MEMORY

RELATED APPLICATIONS

This application is a continuation-in-part of U.S. Ser. No. 07/630,027, filed Dec. 19, 1990, entitled "Ferroelectric. Space Charge Capacitor Memory System", by Ciaran J. Brennan, now U.S. Pat. No. 5,151,877, and U.S. Ser. No. 07/630,038, filed Dec. 19, 1990, entitled "Ferroelectric Space Charge Capacitor Memory", by Ciaran J. Brennan now U.S. Pat. No. 5,140,548.

FIELD OF INVENTION

This invention relates to a ferroelectric space charge capacitor analog memory, and more particularly to such a memory which effects the memory function through the variation in capacitance resulting from the variation in the space charge with respect to the internal polarization.

BACKGROUND OF INVENTION

Several technologies would benefit from a non-volatile integrated circuit analog memory. Voice recorders could use a small analog memory integrated circuit instead of a bulky mechanical tape drive. Electronic cameras could record images with no moving parts. Analog integrated circuit memory is needed to produce analog neural networks capable of reproducing the functions of animal nervous systems in electronic devices. Present non-volatile analog memories consist primarily of magnetic tape memories and floating-gate analog integrated circuit memories. Both of these have disadvantages compared to an analog ferroelectric memory. The disadvantage of magnetic tape memory is the use of mechanical systems to access the data. Tape systems are slow, bulky, require substantial power, are subject to mechanical wear-out, and are sensitive to shock and vibration. The data on the tape is stored sequentially, so the tape must be rewound or fast-fowarded to gain access to a particular piece of information.

Floating gate analog memories use devices referred to as EEPROMS (electrically-erasable programmable read-only memories). The EEPROM technology was originally used only as digital memory but has recently been adapted to serve as analog memory. These memories store data by means of electrical charge stored on an insulated (floating) gate of a MOSFET transistor. Each floating gate transistor stores one analog value, which is represented by the amount of current conducted by the transistor. The amount of current is regulated by the amount of charge stored on the floating gate for that transistor. The disadvantages of floating gate memories are that they are slow to write data, slow to erase data, and are very sensitive to radiation. The floating gate analog memory also requires complicated circuitry in the integrated circuit to perform the writing of the analog information.

SUMMARY OF INVENTION

It is therefore an object of this invention to provide an improved analog integrated circuit memory.

It is a further object of this invention to provide such an improved analog integrated circuit memory which is non-volatile.

It is a further object of this invention to provide such an improved analog integrated circuit memory which is low-power, less sensitive to shock and vibration, and smaller.

It is a further object of this invention to provide such an improved analog integrated circuit memory which allows random access for storage and retrieval.

It is a further object of this invention to provide such an improved analog integrated circuit memory which is generally linear and requires very simple circuitry.

It is a further object of this invention to provide such an improved analog integrated circuit memory which provides potentially much higher density data storage.

It is a further object of this invention to provide such an improved analog integrated circuit memory which is faster.

It is a further object of this invention to provide such an improved analog integrated circuit memory which is radiation hard.

The invention results from the realization that a practical non-volatile non-destructive memory device can be constructed using a ferroelectric space charge capacitance device in which the hysteresis capacitance effected by the internal polarization and space charge regions in combination with an applied electric field define a number of distinguishable, stable and sensible states for storing analog values.

This invention may suitably comprise, consist of, or essentially consist of a ferroelectric space charge capacitor analog memory device comprising a pair of spaced first and second electrodes and a ferroelectric dielectric disposed between the electrodes. There are means for applying to the dielectric a write signal equal to or greater than the coercive voltage to write the dielectric into a predetermined polarization state in the range from zero to maximum coerced polarization and to establish, proximate the interface between the dielectric and each electrode, a space charge region having a charge opposite to that applied to the electrode, with a neutral region between the space charge regions. The relative sizes of the neutral and space charge regions define the capacitance of the dielectric. The neutral region has an internal polarization field opposite to that represented by the space charge regions. There are means for applying to the dielectric a bias voltage less than the coercive voltage at a rate slower than the rate of space charge formation to define the capacitance level representative of the predetermined polarization state. There are also means for introducing to the dielectric a read signal at a rate faster than the rate of space charge formation which together with the bias voltage is less than the coercive voltage, and means responsive to the introduction of the read signal to the dielectric for determining the capacitance level representative of the predetermined polarization state.

In a preferred embodiment, the means for determining the capacitance may include means for detecting the displacement current transferred through the dielectric in response to the read signal. The means for applying may include means for varying the charge transferred by the write signal to vary the size of the space charge regions, the capacitance of the neutral region, and the polarization of the dielectric. The means for varying may include means for changing the magnitude of the write signal. The bias voltage establishes an electric field that increases the internal electric field and the size of the space charge region, with a concomitant decrease in capacitance when it is additive with the internal polarization field, and decreases the internal electric field and the size of the space charge region with a concomitant increase in capacitance when it is subtractive with the internal polarization field. The read signal may momentarily induce through the dielectric a displacement current which is proportional to the capacitance representative of the polarization state of the dielectric. The electrodes may be metal and the space charge regions may be in the dielectric, or the electrodes may be semiconductors and the space charge regions may be at least partially in the electrodes.

In another embodiment a ferroelectric space charge capacitor analog memory system may be formed with a ferroelectric space charge capacitor memory cell including two ferroelectric space charge capacitor analog memory devices. There are means for applying a coercive write voltage to each of the memory devices to establish internal polarization fields in space charge regions of opposite polarities in each device, respectively. The difference in the polarization fields represents an analog value to be stored. There are means for applying to each of the devices a bias voltage less than the coercive voltage at a rate slower than the rate of space charge formation to define a capacitive level representative of one of the polarization states. There are also means for introducing to each device a read signal at a rate faster than the rate of space charge formation which together with the bias voltage is less than the coercive voltage, and means responsive to the read signal for indicating the difference in charge transferred by each memory device representing the analog values stored in the memory cell. The memory system may further include means for selectively connecting either the coercive write voltage to the memory cell or the charge transferred to the means for indicating. The means for applying a bias voltage and the means for introducing a read signal may be connected in parallel with the memory devices in the cell. The means for applying a bias voltage and the means for introducing a read signal may be connected continuously to the memory devices in the cell.

DISCLOSURE OF PREFERRED EMBODIMENT

Other objects, features and advantages will occur to those skilled in the art from the following description of a preferred embodiment and the accompanying drawings, in which.

Figure 1:
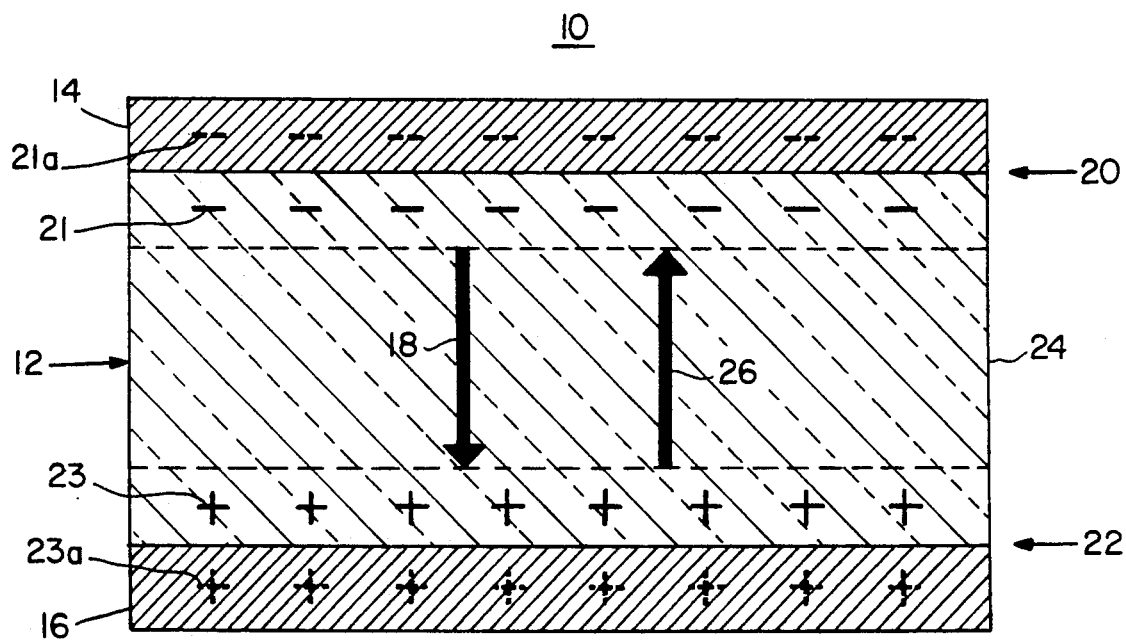
FIG. 1 is a schematic diagram of a ferroelectric space charge capacitance analog memory device according to this invention.

There is shown in FIG. 1 a ferroelectric space charge capacitor memory device 10 including a ferroelectric dielectric medium 12 disposed between a pair of spaced electrodes 14 and 16. Ferroelectric dielectric medium 12 may be a lead-zirconium-titanate or lead-titanate ferroelectric available from Raytheon or National Semiconductor. When an external electric potential is applied across electrodes 14 and 16, an internal polarization field indicated by vector 18 is established in dielectric medium 12 by the alignment of the electric dipoles. This internal polarization field is in the same direction as the externally applied potential or voltage at electrodes 14 and 16. There results an accumulation of charge in space charge regions 20 and 22. If electrodes 14, 16 are metal, space charge regions 20, 22 are in dielectric 12 as indicated by the full line − and + signs 21, 23, respectively. If electrodes 14, 16 are semiconductor material then space charge regions 20, 22 may be in both the electrodes 14, 16 and dielectric 12 as indicated by full line − and + signs 21, 23 and dashed − and + signs 21a, 23a. Space charge region 20 accumulates negative charges since it is proximate electrode 14 which has a positive potential applied to it, while space charge region 22 accumulates a positive charge since it is associated with electrode 16 that has a negative potential applied to it. The accumulations of space charge at the contacts produces an electric field 26 which opposes the remanent polarization.

A neutral region 24 occurs between space charge regions 20 and 22. The size of this neutral region 24 relative to the space charge regions establishes the capacitance value of the capacitor constituted by electrodes 14 and 16 with the dielectric material between them. As neutral region 24 becomes larger, so too does the capacitance of device 10. The size of the neutral region available to establish the capacitance value of device 10 varies inversely to the applied field. That is, as the field across electrodes 14 and 16 grows larger the neutral region 24 grows smaller, and so does the capacitance of device 10.

If the initial voltage or write voltage applied across electrodes 14 and 16 reaches the coercive voltage of dielectric 12, then a certain amount of polarization, the remanent polarization, remains even after the external electric potential is removed from electrodes 14 and 16. If it is later desired to read out device 10, that is, to determine its remanent state, it is only necessary to apply a bias voltage across the electrodes 14 and 16 which is less than the coercive voltage and then apply a small read pulse which will produce a current proportional to the value of the capacitance established in neutral region 24. The nature of the device 10 which enables it to be used as a memory can be better understood with respect to FIG. 2, which shows the capacitance hysteresis characteristic 30a of device 10.

When the system moves from point 32 by a positive voltage through knee 34a, leg 36a and toe 38a, back along leg occurs. If the write voltage instead is applied in the negative direction so that the system moves through knee 42a, leg 44a and toe 46a, and back up leg 48a to point 32a, then the space charge regions will be charged oppositely from that shown in FIG. 1 and the internal polarization vector 18 will be reversed, to thereby establish the other polarization state.

Figure 2:
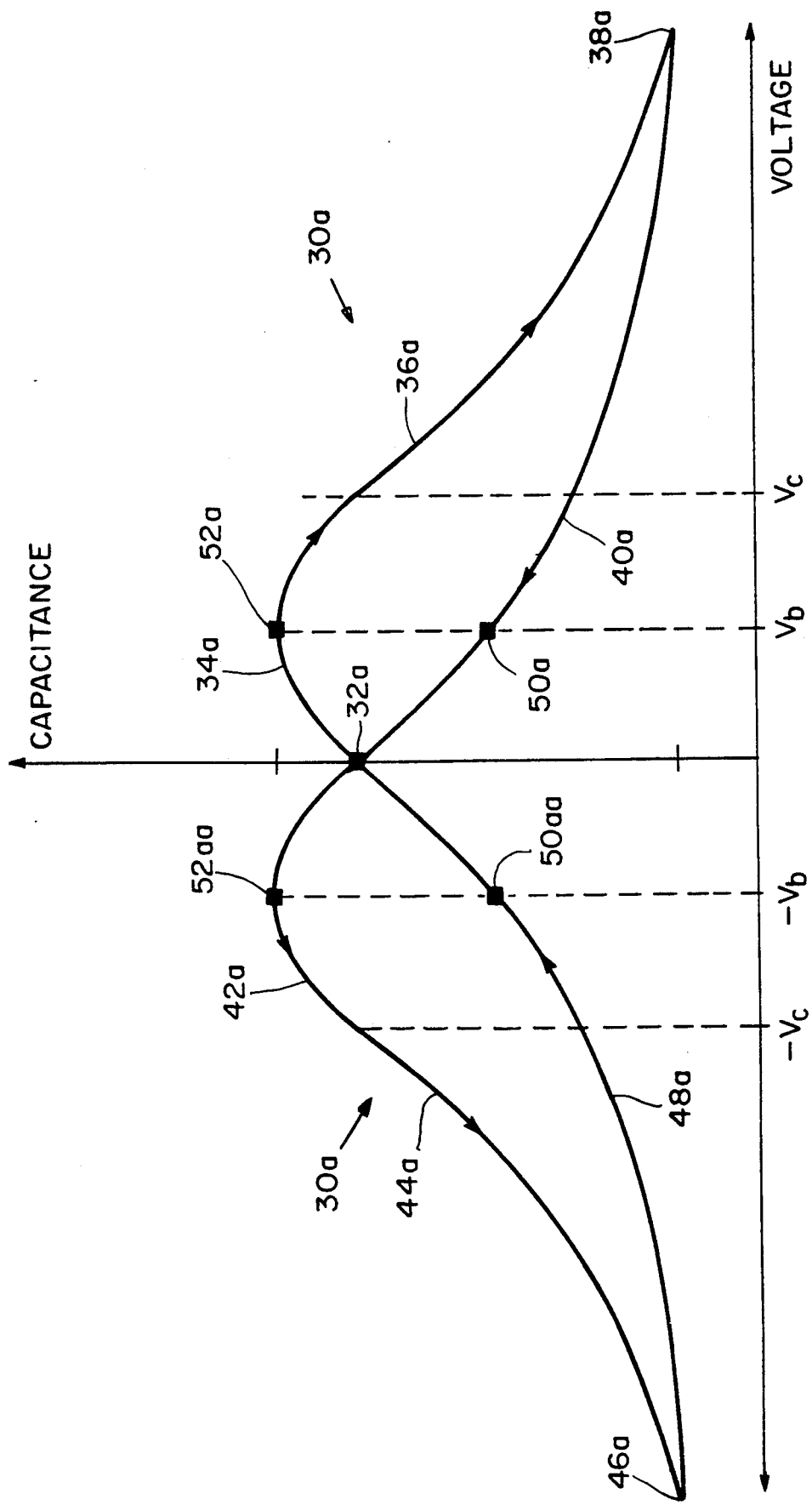
FIG. 2 is an illustration of the capacitance hysteresis characteristic of the ferroelectric capacitance analog memory device of FIG. 1.

In operation, with zero voltage applied across electrodes 14 and 16, the dielectric 12 is in the condition indicated at point 32a in FIG. 2. If the voltage across electrodes 14 and 16 is then increased, the capacitance value of the ferroelectric medium 12 increases up along knee 34a along leg 36a to positive toe 38a. If at this point the positive voltage is decreased the capacitance value moves along leg 40a back to point 32a. If the voltage is now increased in the negative direction, the capacitance value increases toward knee 42a and then decreases down leg 44a to the negative toe 46a. A decrease in the negative voltage now moves the capacitance value along leg 48a back to point 32a.

This capacitance hysteresis effect in the dielectric 12 can be utilized as a memory device. For example, if a voltage has been applied at point 32a, which drives the capacitance value up over knee 34a, down leg 36a to toe 38a and back along leg 40a so that the system has been driven beyond the coercive voltage VC and back again to the lower, positive bias voltage $V_b$ at point 50a on leg 40a, the bit of information has been written into dielectric medium 12. If the voltage across electrodes 14 and 16 is now removed completely so that the system reverts to point 32, ferroelectric medium 12 stores or remembers its last previous condition at point 50a. Subsequently, if a bias voltage $V_b$ is applied, ferroelectric medium 12 moves back down leg 40a to point 50a. Now a small high-frequency pulse superimposed on $V_b$ at 50a causes a current to flow through medium 12 which is proportional to its capacitance and will thus reflect its polarization condition, which in this case is the polarization condition indicated by the low capacitance level at 50a.

If during the write cycle the voltage was driven negative from point 32 over knee 42a, down leg 44a to toe 46a, back again up leg 48a, through zero point 32a, to point 52a on knee 34a, then when the voltage is removed and the system reverts to point 32a, it is the point 52a condition that will be remembered. Thus subsequently when the read bias $V_b$ is applied, the system will move to point 52a, which is a much higher capacitive state, indicating the other polarization state. Thus when a small high-frequency read pulse is applied, a higher level of current flow indicating a higher level of capacitance will be indicated. Using a negative bias such as $-V_b$ results in capacitance values 50aa and 52aa being selected.

The bias voltage $V_b$, be it positive or negative, must not exceed the coercive voltage, $V_b$ must be applied at a rate slower than the rate at which the space charge can form, and the read pulse should have a high enough frequency, typically 1000 cycles per second or greater, so that it can induce the current to detect the capacitance level before the space charge distributions can be affected. The signal should be small in magnitude so that it does not exceed the coercive voltage when added to the bias voltage.

Figure 3:
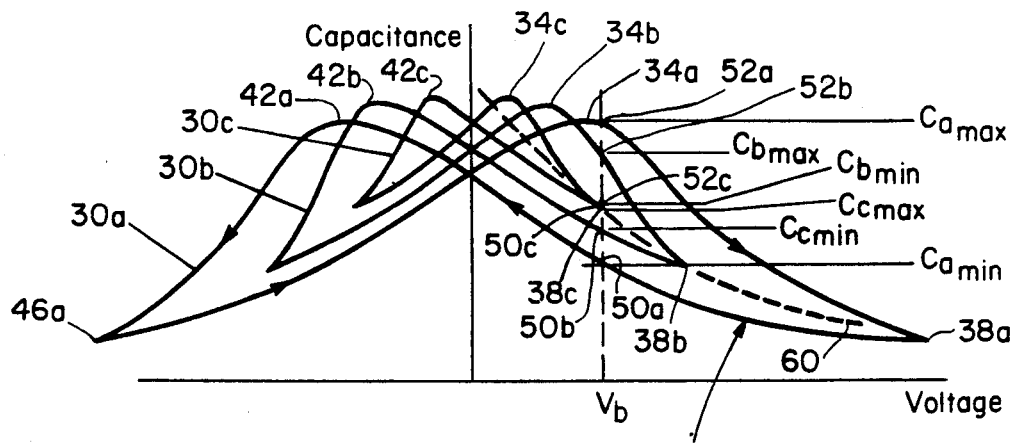
FIG. 3 is an illustration of a family of capacitance hysteresis characteristics of the ferroelectric capacitance analog memory device according to this invention obtained with various write voltages equal to or exceeding the coercive voltage.

The operation of device 10 as an analog memory is achieved by varying the write signal over a range in which the write signal equals or exceeds the coercive voltage to obtain a family of hysteresis characteristics including characteristic 30a of FIG. 2 as well as additional characteristics 30b and 30c, FIG. 3. Characteristics 30a, b and c are each obtained in the same way but using a slightly lower write voltage. As the write voltage decreases the peak capacitance increases, as can be seen by comparing peaks 34a and 42a with 34b and 42b, and further with peaks 34c and 42c. Also note that the peaks within each characteristic come closer together as the voltage decreases and the capacitance increases. Thus peaks 30c and 42c are closer together than peaks 34b and 42b, which are closer than peaks 34a and 42a. All of the end points of the hysteresis 38a, 38b, 38c obtained at the various write voltages lie along equilibrium line 60 which is the path initially tracked by the characteristics during the initialization in the unpolarized state.

When read out using $V_b$, it can be seen that characteristic 30a will provide a capacitance for either $C_a$ max or $C_a$ min depending upon the point along the hysteresis facilitated by the write signal. For a lower voltage write signal, the options become $C_b$ max and $C_b$ min. For even lower write voltage, the options for the capacitance values are $C_c$ max and $C_c$ min. Thus by simply varying the voltage applied to establish the internal polarization field, a virtually infinite number of characteristics 30 with their attendant maximum and minimum capacitance values can be obtained at a single bias point such as $V_b$.

Figure 4:
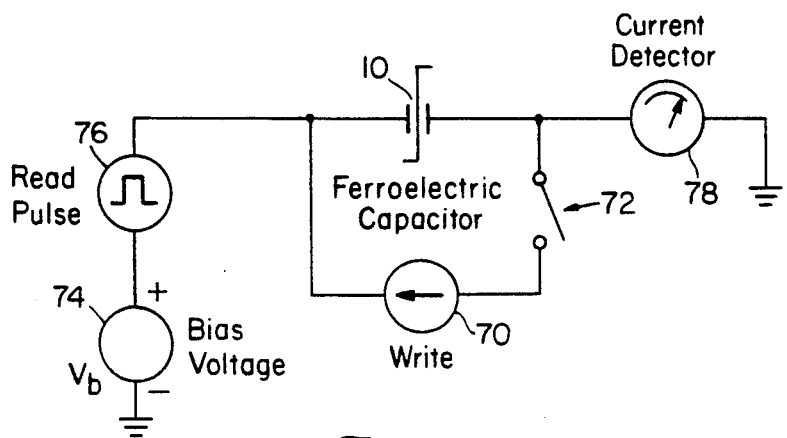
FIG. 4 is a simple ferroelectric memory circuit using a single ferroelectric capacitance analog memory device according to this invention.

A circuit which employs this feature may simply contain a write signal source 70, FIG. 4, connected in series with switch 72, in parallel with ferroelectric capacitor device 10. When switch 72 is closed, device 10 will have an internal field established in it as a function of the charge transferred from write signal source 70. This is directly related to the current from source 70 times the time that the current is allowed to flow. When the time is kept constant, as it normally would in establishing a family of curves 30a–c as shown in FIG. 3, it is the value of the current or the voltage provided by source 70 which determines the value that is stored in device 10. Subsequently, when it is desired to read out the analog values stored in device 10, bias voltage source 74 provides a bias $V_b$ as shown in FIGS. 2 and 3. A short high-frequency read pulse from source 76 superimposed on the bias voltage quickly reads out the polarization field in device 10 without disturbing that field. The current passed to current detector 78 is directly a function of the capacitance of device 10, which in turn is a function of the internal field which has been induced in it by the write signal from source 70.

Figure 5:
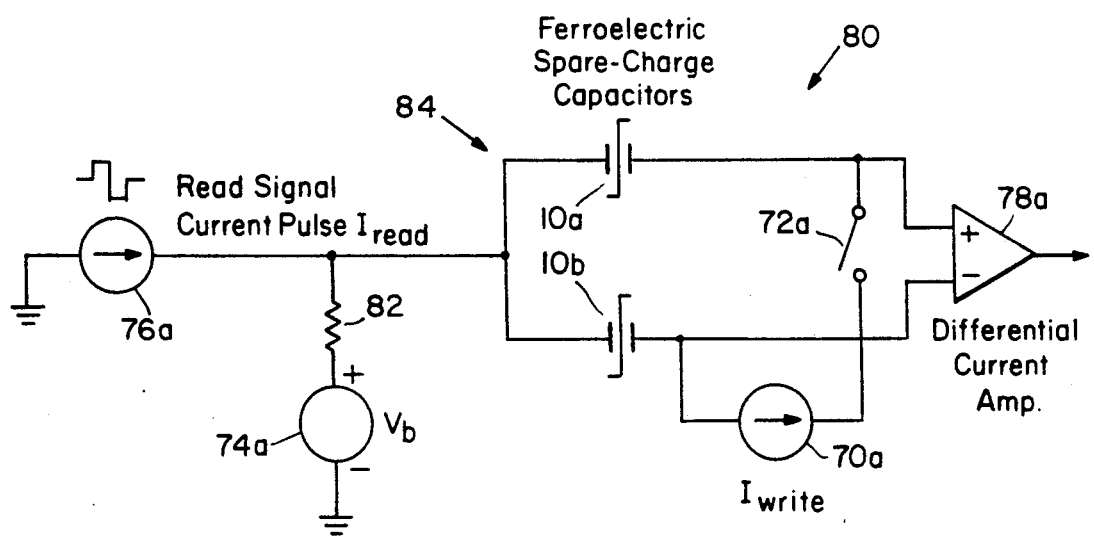
FIG. 5 is a simplified schematic diagram of a ferroelectric capacitive analog memory differential circuit using a pair of ferroelectric capacitive memory devices according to this invention.

In another embodiment, two devices according to this invention, 10a and 10b, FIG. 5, can be connected in differential circuit 80, where detector 78 is implemented for example by a differential amplifier 78a. Write source 70a is interconnected through switch 72a to both devices 10a and 10b. It supplies its write signal directly to device 10a and the inverse of the write signal to device 10b. Thus devices 10a and 10b have induced in them equal but opposite internal polarization fields. Subsequently, when source 74a applies $V_b$ through a suitable resistor 82 for example, the read signal from source 76a produces an amplification factor which is determined by the difference in capacitance between the two devices 10a and 10b at $V_b$. If the two devices have the same capacitance, the output is zero. If the capacitance of the non-inverting device 10a is larger, the output from differential amplifier 70a will be positive. If the converse, it will be negative. The analog value stored in cell 84, which comprises both devices 10a and 10b, is determined by the remanent polarization of the devices set by the write signal from source 70a. The greater remanent polarization induced by the write signal from source 70a, the greater the separation in the capacitance values, and so the greater the amplification of the circuit.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A ferroelectric space charge capacitor analog memory device comprising:

a pair of spaced first and second electrodes;

a ferroelectric dielectric disposed between said electrodes;

means for applying a write signal equal to or greater than the coercive voltage to said dielectric to write said dielectric into a predetermined polarization state in the range from zero to maximum coerced polarization and to establish proximate the interface between said dielectric and each electrode, a space charge region having a charge opposite to that applied to the electrode with a neutral region between the space charge regions, the relative sizes of said neutral and space charge regions defining the capacitance of the dielectric, said neutral region having an internal polarization field opposite to that represented by the space charge regions;

means for applying to said dielectric a bias voltage less than the coercive voltage at a rate slower than the rate of space charge formation to define a capacitance level representative of said predetermined polarization states;

means for introducing to said dielectric a read signal at a rate faster than the rate of space charge formation which together with the bias voltage is less than the coercive voltage; and means, responsive to the introduction of the read signal to said dielectric, for determining the capacitance level representative of said predetermined polarization state.

2. The ferroelectric space charge capacitor analog memory device of claim 1 in which said means for determining the capacitance includes means for detecting the displacement current transferred through said dielectric in response to said read signal.

3. The ferroelectric space charge capacitor analog memory device of claim 1 in which said means for applying includes means for varying the charge transferred by said write signal to vary the size of the space charge regions the capacitance of the neutral region and the polarization of the dielectric.

4. The ferroelectric space charge capacitor analog memory device of claim 3 in which said means for varying includes means for changing the magnitude of said write signal.

5. The ferroelectric space charge capacitor analog memory device of claim 1 in which said bias voltage establishes an electric field that increases said internal electric field and the size of said space charge region with a concomitant decrease in capacitance when it is additive with said internal polarization field, and decreases said internal electric field and the the size of said space charge region with a concomitant increase in capacitance when it is subtractive with said internal polarization field.

6. The ferroelectric space charge capacitor analog memory device of claim 1 in which said read signal momentarily induces through said dielectric a displacement current which is proportional to the capacitance representative of the polarization state of said dielectric.

7. The ferroelectric space charge capacitor analog memory device of claim 1 in which said electrodes are metal and said space charge regions are in said dielectric.

8. The ferroelectric space charge capacitor analog memory device of claim 1 in which said electrodes are semiconductors and said space charge regions are at least partially in said electrodes.

9. A ferroelectric space charge capacitor analog memory system comprising:

a ferroelectric space charge capacitor memory cell including two ferroelectric space charge capacitor analog memory devices;

means for applying a coercive write voltage to each of said memory devices to establish internal polarization fields and space charge regions of opposite polarities in each said device, respectively, the difference in said polarization fields representing an analog value to be stored;

means for applying, to each of said devices, a bias voltage less than the coercive voltage at a rate slower than the rate of space charge formation to define a capacitive level representative of one of the polarization states;

means for introducing to each said device a read signal at a rate faster than the rate of space charge formation which together with the bias voltage is less than the coercive voltage; and means, responsive to the read signal, for indicating the difference in charge transferred by each memory device representing the analog value stored in said memory cell.

10. The ferroelectric space charge capacitive analog memory system of claim 9 further including means for selectively connecting either said coercive write voltage to said memory cell, or said memory cell to said means for indicating.

11. The ferroelectric space charge capacitor analog memory device of claim 9 in which said means for applying a bias voltage and said means for introducing a read signal are connected in parallel to each other and in series with said memory devices in said cell.

12. The ferroelectric space charge capacitor analog memory device of claim 9 in which said means for applying a bias voltage and said means for introducing a read signal are connected continuously to said memory devices in said cell.

* * * * *